United States Patent [19]

Reamot et al.

[11] Patent Number: 4,947,337
[45] Date of Patent: Aug. 7, 1990

[54] DEVICE FOR THE DISTRIBUTION OF LARGE NUMBERS OF ELEMENTS ON TRAYS

[75] Inventors: Hervé Reamot, Dijon; Claude Bredillet, Fontaine les Dijon; Pierre Brisville, Arc sur Tille, all of France

[73] Assignee: Compagnie Europeenne de Composants Electroniques LCC, Courbevoie, France

[21] Appl. No.: 186,307

[22] Filed: Apr. 26, 1988

[30] Foreign Application Priority Data

Apr. 29, 1987 [FR] France .............................. 87 06105

[51] Int. Cl.$^5$ ........................... B07C 5/02; B07C 9/00
[52] U.S. Cl. ..................................... 364/478; 364/555; 209/698
[58] Field of Search ................ 209/698, 564, 565; 198/349.6, 349.7, 341; 364/148-151, 191-193, 478, 156, 555; 220/448; 118/503

[56] References Cited

U.S. PATENT DOCUMENTS

| | | | |
|---|---|---|---|
| 3,958,687 | 5/1976 | Adams et al. | 198/220 BA |
| 4,393,808 | 7/1983 | Braden | 118/503 |
| 4,395,184 | 7/1983 | Braden | 414/417 |
| 4,667,830 | 5/1987 | Nozaki, Jr. et al. | 209/3.1 |
| 4,697,245 | 9/1987 | Kara et al. | 364/552 |
| 4,717,006 | 1/1988 | Chapman et al. | 194/318 |
| 4,754,410 | 6/1988 | Leech et al. | 364/513 |
| 4,811,197 | 3/1989 | Wexler | 364/148 |

Primary Examiner—Jerry Smith
Assistant Examiner—P. Gordon
Attorney, Agent, or Firm—Oblon, Spivak, McClelland, Maier & Neustadt

[57] ABSTRACT

A device for the distribution of a large number of element on a tray housed in a container for these elements. The elements are distributed by a mechanical action communicated to the container during a specified period. The device has a system which functions in a learning mode by the recording of parameters of mechanical action and by the storing of these parameters. This system also enables the automatic functioning of the device according to the recorded parameters.

7 Claims, 4 Drawing Sheets

PRIOR ART FIG_1
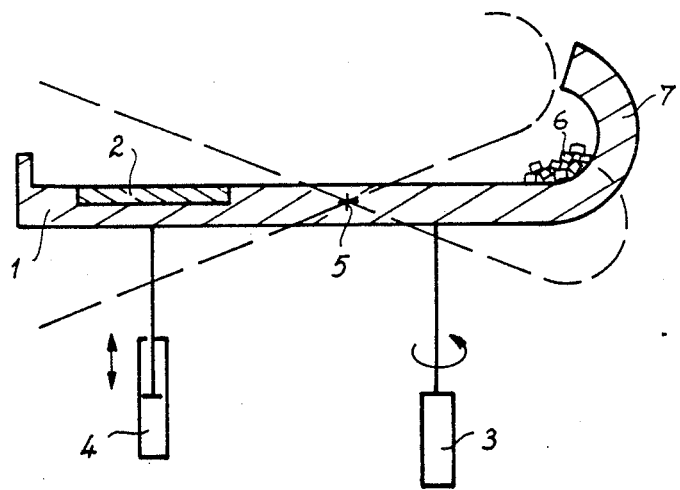
FIG_2 PRIOR ART
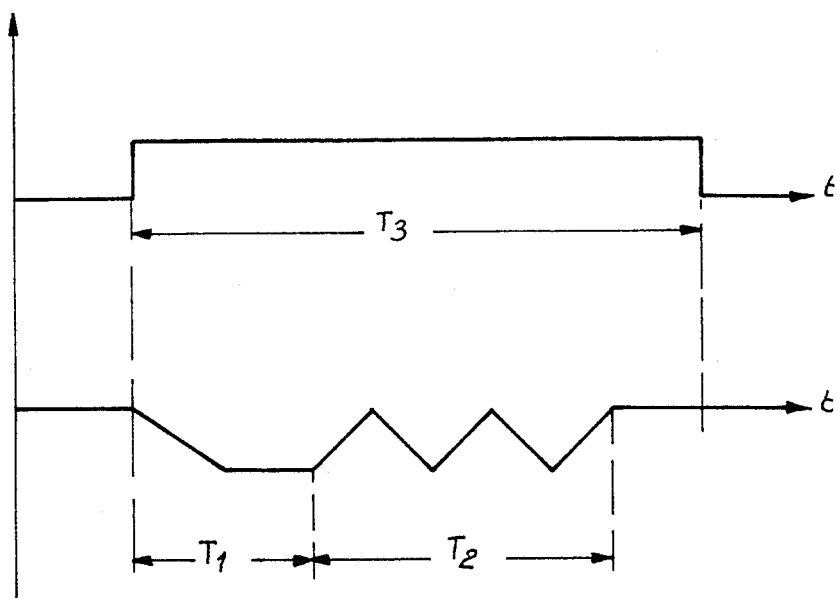

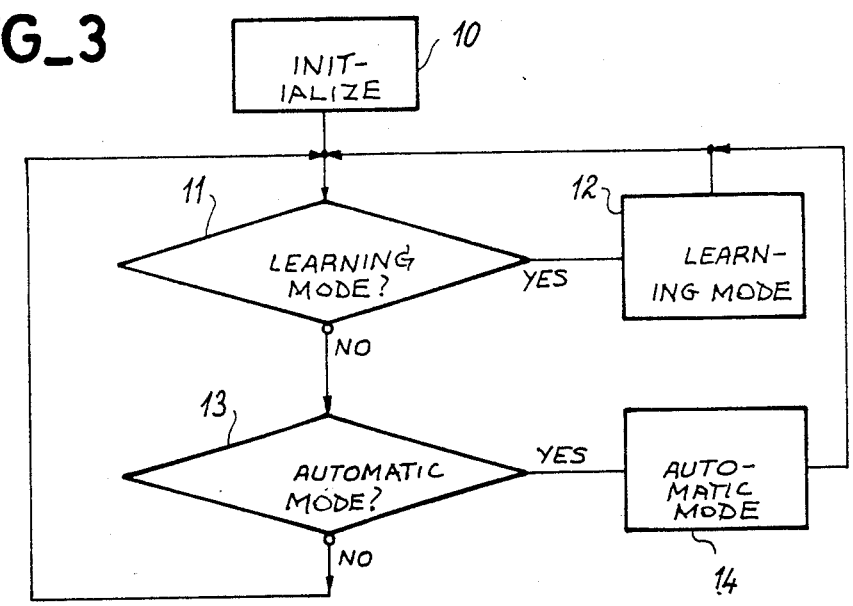
FIG_3
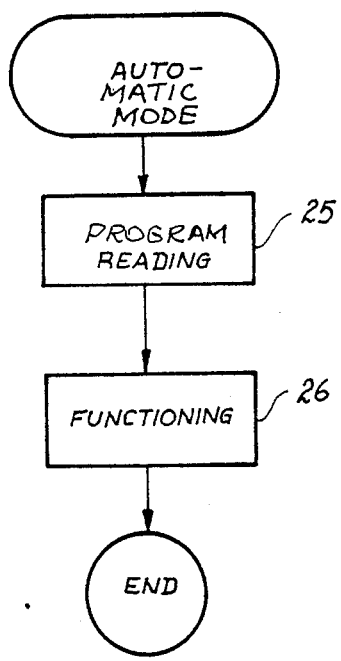
FIG_5

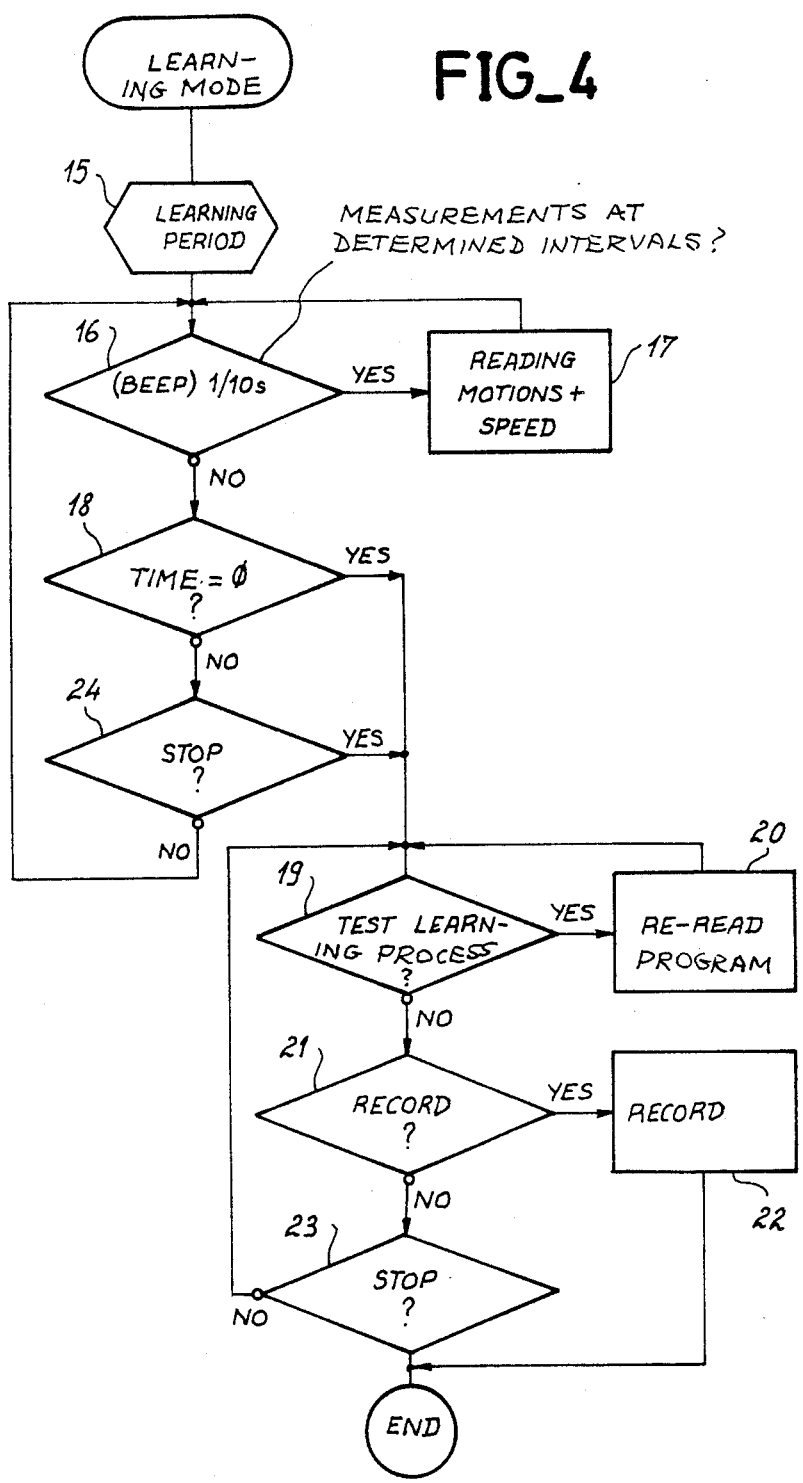
FIG_4

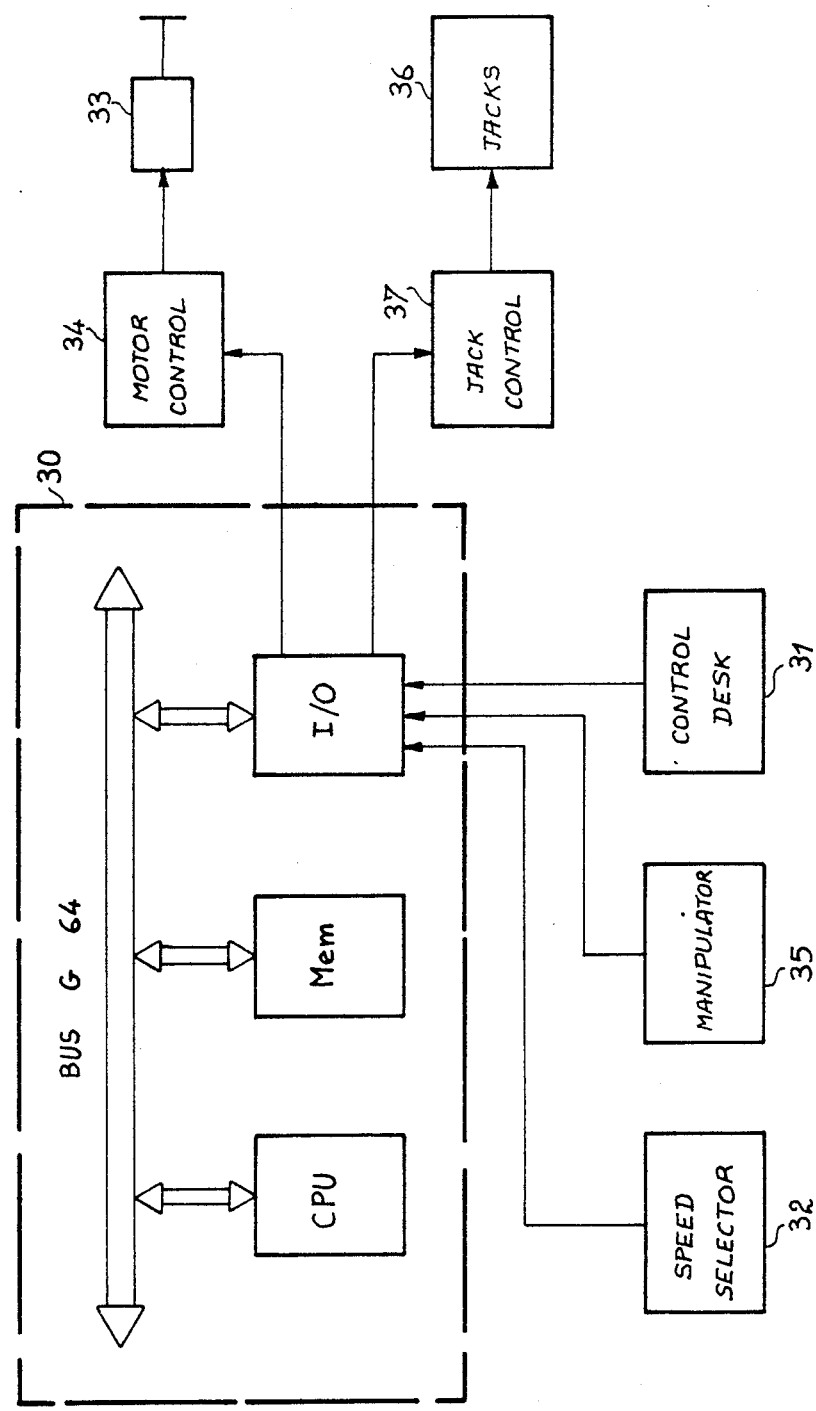
FIG_6

DEVICE FOR THE DISTRIBUTION OF LARGE NUMBERS OF ELEMENTS ON TRAYS

BACKGROUND OF THE INVENTION

1. Field of the Invention

The present invention pertains to a device for the distribution of large number of elements on trays. In particular, it can be used to distribute chip capacitors on alveolate trays.

2. Description of the Prior Art

There are various known devices for the distribution or arranging of large numbers of elements in packages or on alveolate trays. These devices use electromagnetic or mechanical vibrating systems or vibrators. Electromagnetic vibrators use electromagnetic effect and prevent the elements, that are to be distributed, from colliding with one another. These electromagnetic vibrators are well suited to conveying elements up to a given place, but cannot be used to arrange the elements. On the contrary, mechanical vibrators, which use mechanical effect, enable the elements to collide thus making it easier to arrange and distribute them. For the arranging of chip capacitors on alveolate trays, there is a prior art machine which handles the chips from the moment of their arrival, in loose condition, up to the electrical testing, silver-plating, tinning and marking operations. This machine uses a mechanical vibrator and requires a permanent operator who must see to it that the set parameters are complied with. Experience shows that, beyond four set parameters, the operator has great difficulty in mastering the timings and speed adjustments of the vibrator motors. Interference among the parameters and the fact that they are estimated empirically does not make it easier to apply them. These problems result in inefficient distribution.

To remove these drawbacks, the invention proposes a learning system where full scope is given to the operator's discretion without any constraints on reflection or interpretation. The operator can fill in a tray using a manipulator that works in several directions, for side and front motions, and a variable-speed drive unit to control the speed of the vibrator motor. Thus, in this case, here are only two actuators at the disposal of the operator. The learning system takes these different actions into account at determined instants during the estimated time needed for the distributing operation to take place. When the filling in operation is over, the operator requests automatic functioning for the second operation. If the test result is conclusive, the program can be memorized. Several programs can be thus stored. It is thus possible to look for an already tested program for a specified type of part without any loss of time.

SUMMARY OF THE INVENTION

An object of the invention, therefore, is a device for the distribution of a large number of elements on a arranging tray housed in a container for the elements, these elements being distributed through a mechanical action transmitted to the container for a determined period. The device includes a system by which it can work in learning mode by recording parameters of mechanical action and storing these parameters. This system enables the automatic functioning of the device according to the recorded parameters.

BRIEF DESCRIPTION OF THE DRAWINGS

The invention will be better understood and other advantages will be appear from the following description, given as a non-restrictive example, and from the appended drawings, of which:

FIG. 1 shows a schematic view of a prior art device for the distribution of elements, FIG. 2 consists of graphs explaining the functioning of the device of FIG. 1.

FIG. 3 is an overall flow chart applied in the device according to the present invention.

FIG. 4 is a flow chart of the operation of the learning section of the diagram of FIG. 3.

FIG. 5 is a flow chart of the specifics of the automatic section of the flow chart of FIG. 3.

FIG. 6 is a block diagram illustrating a device according to the invention.

DESCRIPTION OF THE PREFERRED EMBODIMENT

The following part of the description relates especially to the distribution of chip capacitors on alveolate trays. However, it is understood that the invention can be applied to any other element and that the housings of the trays can have other geometries.

The prior art device shown in FIG. 1 has a container 1 in which there is an alveolate tray 2. The container 1 can be moved by a complex motion caused by the motor 3 and the jack 4. The motor 3 is a variable-speed motor linked to a cam. It gives a curved vibrational motion of adjustable amplitude and frequency. The jack 4 enables the container 1 to see-saw on the axis 5. It enables the container to take the extreme positions shown with broken lines in the figure. The device works as follows. The capacitor chips to be distributed, shown under the general reference 6, are first collected in loose form, in the container elbow 7 located opposite the tray 2. Through the action of the jack 4 and the motor 3, the capacitor chips are brought to the tray 2 and are housed with varying speeds in the alveoli of the tray. Several see-saw motions of the tray, through the action of the jack, are needed. When a sufficient number of capacitors has been distributed, a final see-saw motion of the container brings the surplus capacitors back to the elbow 7, and the tray is removed.

The efficiency with which the chips are distributed depends on the rate at which the tray is filled in and on the time spent on this operation. It is therefore important for the operator to properly master several parameters consisting of the rise and fall times of the jack and the number of these times, the speed of the motor, the total duration of the operation and the combination of jack and motor actions.

The graphs of FIG. 2 show an example of an operation cycle imposed on the device of FIG. 1, as a function of the time t. In the top graph, $T_3$ represents the total duration of the cycle. The bottom graph represents the motions of the jack 4: downward motion, upward motion and horizontal state. With the jack initially in the top position, the chip capacitors are delivered to the elbow 7 of the container 1. In the first part of $T_1$ (corresponding to the downward motion of the jack), the capacitors are brought from the elbow to the tray. With the jack in the bottom position, the motor is started up and the capacitors are distributed in the alveoli of the tray. $T_2$ represents the time during which the capacitors are swept onto the tray. This sweeping operation is caused by the successive upward and downward motions of the jack and by the motion that the motor 3 communicates to the container. At the end of the cycle, the jack is once again in the top position in order to remove capacitors, not yet placed in the alveoli, to the elbow 7.

It is not easy for the operator to master these different parameters. Furthermore, the geometry and weight of the capacitors may differ from one series to another, and this factor affects distribution. All this results in an unsatisfactory filling-in rate for a determined period of the operation. The invention improves the efficiency of the operation through a learning method Through this method, the container can be given a third motion which increases the tray filling-in rate. This third motion may be, for example, a lateral see-sawing of the container.

The learning method enables the device to improve its functioning by taking prior results into account. This learning method can be implemented according to the flow charts shown in FIGS. 3 to 5. FIG. 3 shows a simplified flow chart of the learning process. The block 10 represents the turning on or initialization (INIT) of the system. The block 11 is a test: if it is desired to carry out a learning operation (LEARN) one goes to block 12, if not, one goes to the block 13. If a learning operation has been requested, one returns to block 11 once this learning operation has been performed. If a learning operation has been rejected, one goes to block 13 which is a test of automatic functioning (AUTO). If automatic functioning has been requested, one goes to block 14 and, after the automatic functioning has been completed, one returns to block 11. If automatic functioning has been rejected, one returns to block 11.

FIG. 4 is a developed flow chart of the learning stage shown in block 12 of FIG. 3. The block 15 sets the maximum learning period, for example 60 seconds. The block 6 is a test which asks whether or not certain measurements should be made at determined intervals (BEEP), for example, at every tenth of a second. If the answer is "yes", one goes to block 17 which represents the reading of certain parameters (motions, speed) that determine the distribution, and the writing of these parameters in a memory. Then one returns to the test 16 to re-start a read cycle for as many times as the learning period is not completed. If the response to the test 16 is negative, one goes to the test 18 which determines whether the set period of time (tempo) is completed or not. If the answer is positive, one goes to the test 19 which asks whether it is wished to test the learning process performed earlier. If the answer is "yes", one goes to block 20, i.e. the program (PRG) previously recorded in the memory is re-read and one returns to the test 19. If the answer to the test 19 is negative, one goes to the test 21 which asks whether this program should be recorded (REC) in order to save it. If the answer is yes, one goes to block 22 for execution, and the learning operation is over. If not, one goes to the test 23 to stop or to repeat the learning test. If the answer to the test 18 is negative, one goes to the test 24 which asks whether the learning operation should be stopped. If the answer is positive (for example, when the learning stage is considered to be over before the set time limit) then one goes to the test 19 and to the cycle which has already been described. If the answer is negative, one returns to the test 16.

FIG. 5 is a developed flow chart of the automatic functioning stage represented by the block 14 in FIG. 3. When automatic functioning is requested, the block 25 triggers the reading of the desired program, the instructions of which are sent to the block 26 which determines the functioning of the container.

The means used to mechanically move the container supporting the alveolate tray may be: a variable-speed motor linked to a can which gives a vibrational curved motion of adjustable amplitude and frequency, a three-position jack to give a sideways oscillation and a standard two-position jack to enable the set to tilt forward. It is theoretically possible to add other motions, but this would be beyond the operator's capacity to handle. These motions are variable in speed and duration It should be possible for the motor rotation to vary during the cycle. A high frequency of the vibrations caused will make the parts reach the alveoli quickly, and a lower, modulated frequency will give optimal arrangement. At the end of the cycle, a strong vibration is needed to make surplus parts leave the tray quickly The speed of the jacks, on the contrary, is fixed by the through-put limiters.

Each type of part to be arranged requires different cycle parameters which depend on the geometry and weight of the parts. For chip capacitors, the geometry and weight may vary in a ratio of one to six depending on the model used. With the device of the invention, an experienced operator can fill in a tray with 800 alveoli (40 columns of 20 rows) at 99% in a maximum time of 60 seconds.

The operator can fill in a tray with a multiple-direction manipulator for side and front motions. A five-position switch can control the motor speed through a set of resistors. Hence, only actuators (the manipulator lever and the switch) are available to the operator. The learning system takes the operator's various actions into account at intervals of one tenth of a second for a maximum period of one minute. Known types of position sensors and speed sensors are used to collect this data. When the filling-in operation is over, the operator requests automatic functioning for a second operation. If the test is conclusive, the program can be memorized. An encoding wheel can be used to give a reference to this program which is stored with other programs (for example, 10 programs). It is thus possible to search for a program that has been tried out for a specified type of part without any loss of time. The equipment used may consist of standard BUS G64 compatible sub-assemblies. The microprocessor Motorola 6909 may be used. A 19-inch 3U rack contains all the automatic control equipment consisting of a central processing unit board, a RAM memory board of eight ko (saved) and four ko (program REPROM) and an input/output board. FIG. 6 is a block diagram illustrating a device according to the invention and using a microprocessor 30 of the above-described type. The references CPU, Mem and I/0 have been used respectively to designate the central processing unit, memory and input/output boards. A control desk 31 is used to start up and stop the device and to perform the various above-described operations (the setting of the learning time, the measuring intervals etc.). For the example chosen, a speed selector 32 is used to vary the speed of the motor 33 through the motor control circuit 34 and a manipulator 35 is used to control the jacks 36 through a jack control circuit 37. The input/output board I/0 provides the interface between the control elements 31, 32 and 35, the electromechanical systems 34 and 37 and the boards Mem and CPU.

What is claimed is:

1. A device for the distribution of a large number of number of elements on an arranging tray housed in a container, comprising:

means for creating a mechanical action to distribute said elements wherein said mechanical action is transmitted to said container for a predetermined time, means for recording parameters of said mechanical action, and means for storing said parameters wherein said means for recording said parameters and storing said parameters constitute a learning mode; and means for enabling the automatic functioning of said distribution according to said recorded parameters.

2. A device according to claim 1 wherein, wherein the mechanical action transmitted to the container is produced by at least one motor.

3. A device according to claim 2 wherein said motor is linked to a cam to give a vibrational curved motion.

4. A device according to claim 3 wherein said motor is a variable-speed motor.

5. A device according to claim 4 wherein the mechanical action communicated to the container is produced by at least one jack.

6. A device according to claim 5 wherein the arrangement tray is an alveolate tray.

7. A device according to claim 1 wherein said elements are capacitors in the form of chips.

* * * * *